(12) United States Patent
Dunn et al.

(10) Patent No.: US 6,201,597 B1
(45) Date of Patent: Mar. 13, 2001

(54) APPARATUS FOR PROJECTION PATTERNING OF LARGE SUBSTRATES USING LIMITED-TRAVEL PRECISION X-Y STAGE

(75) Inventors: Thomas J. Dunn, Mohegan Lake, NY (US); Nestor O. Farmiga, Clifton, NJ (US); Kanti Jain, Briarcliff Manor, NY (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 09/245,700

(22) Filed: Feb. 5, 1999

Related U.S. Application Data

(62) Division of application No. 08/864,160, filed on May 28, 1997, now Pat. No. 5,897,986.

(51) Int. Cl.[7] .................................................. G03B 27/42
(52) U.S. Cl. ............................................. 355/53; 355/55
(58) Field of Search ......................................... 355/53, 55

(56) References Cited

U.S. PATENT DOCUMENTS

| | | | |
|---|---|---|---|
| Re. 35,753 | * | 3/1998 | Raab et al. ................. 430/4 |
| 4,814,830 | * | 3/1989 | Isohata et al. .............. 355/54 |
| 5,103,257 | * | 4/1992 | Wijnaendts Van Resandt ... 355/53 |
| 5,442,418 | * | 8/1995 | Murakami et al. ............ 355/53 |
| 5,686,997 | * | 11/1997 | Shirasu ..................... 356/401 |
| 5,721,606 | * | 2/1998 | Jain ........................ 355/53 |
| 5,721,608 | * | 2/1998 | Taniguchi ................... 355/53 |
| 5,805,866 | * | 9/1998 | Magone et al. .............. 395/500 |

* cited by examiner

Primary Examiner—Safet Metjahic
Assistant Examiner—Etienne LeRoux
(74) Attorney, Agent, or Firm—Carl C. Kling

(57) ABSTRACT

A large-format substrate patterning system, for microelectronics manufacturing, utilizes a substrate docking fixture to enable relative motion between the substrate stage and the substrate. This enables exposure of a large-format substrate which has been partitioned into different modules where each module contains an entire pattern transferred from a mask. This projection system enables patterning of a large multi-module substrate using a stage whose range of travel is smaller than the size of the substrate and using a mask whose area is smaller than the size of the substrate. This is accomplished by repositioning the substrate to expose each module sequentially In order to reposition the substrate, its location is maintained fixed in space by a substrate docking fixture while the movable stage of the lithography system is repositioned to position a different module of the substrate in the image field of the lithography tool. This allows the use of a mask whose size is determined by the size of each substrate module, and the use of a scanning stage whose required range of travel is determined by the size of the substrate module, and not by the size of the entire substrate. This eliminates the size limitation of the substrate from dependence on the range of travel of the stage, and permits the repetitive use of a small mask or series of small masks to produce a composite multi-module pattern on the substrate.

25 Claims, 12 Drawing Sheets

APPARATUS FOR PROJECTION PATTERNING OF LARGE SUBSTRATES USING LIMITED-TRAVEL PRECISION X-Y STAGE

CROSS-REFERENCE TO RELATED APPLICATION

This is a division of Ser. No. 08/864,160 filed on May 28, 1997 U.S. Pat. No. 5,897,986, issued Apr. 27, 1999, Projection Patterning of Large Substrates Using Limited-Travel Precision X-Y Stage, Dunn, Farmiga & Jain.

FIELD OF THE INVENTION

This invention relates to lithography systems for exposing large substrates, and specifically relates to a projection system that enables patterning of a large multi-module substrate using a stage whose range of travel is smaller than the size of the substrate and using a mask whose size is smaller than the size of the substrate. This is accomplished by repositioning the substrate to expose each module sequentially. In order to reposition the substrate, its location is maintained by a substrate docking fixture while the scanning stage of the lithography system is repositioned to place a different module of the substrate in the image field of the projection lens of the lithography tool. This invention allows the use of a mask whose size is determined by the size of each substrate module, and the use of a scanning stage whose range of travel is determined by the size of a substrate module, and not by the size of the whole substrate. This invention removes the limitation on the size of the substrate from its dependence on the size of the mask or on the range of travel of the stage.

BACKGROUND OF THE INVENTION

In the manufacturing of many electronic and opto-electronic products, it is necessary to fabricate millions of microscopic structures on a single large substrate. The structures can be in the form of active devices, such as the transistors in an electronic display or a semiconductor integrated circuit, or in the form of passive patterns, such as the metal interconnect network in a multichip packaging module or a printed circuit board. The large substrate can be a display panel, a silicon wafer, or a board. The pattern feature sizes in these diverse products, which we shall call electronic modules, range from sub-micron for semiconductor chips to multi-microns for displays and packaging products. The substrate size requirements vary from a few square inches for small modules to a few square feet for large displays.

FIG. 1 describes the prior art and schematically illustrates how one type of lithography system is used to transfer the pattern from a mask onto a substrate to expose a single module. The substrate 10 and the mask 14 are held rigidly in a substrate stage 12 and a mask stage 16, respectively. Both the substrate and the mask stages move in synchronism with fine precision. The illumination system 18 consists of a source system 20, a relay lens 22, and beam steering optics 24. The relay lens collects radiation emitted from the effective emission plane of the source into a certain numerical aperture, $NA_S$, and directs it with a certain magnification and numerical aperture, $NA_C$, on to the mask. A projection lens assembly 26, which may consist of several individual lens elements and prisms or mirrors, forms a precise image of the high-resolution pattern contained within the illuminated region on the mask on to the substrate. The projection lens has a numerical aperture NA determined by the resolution requirements of the patterning system and is designed for as large an image field as possible.

The substrate stage 12 scans the substrate across its exposure region so as to traverse the length of the substrate in the direction of the scan. Simultaneously, the mask stage 16 scans the mask across its illuminated region. After completion of a scan, both stages move in a direction orthogonal to the scan direction by an amount termed the 'effective scan width.' Following such a lateral movement, a new scan is generated by precise movements of the substrate and mask stages in the same manner as before. The above exposure process is repeated until the entire substrate is exposed. A control system 30 is functionally coupled to the illumination system, the mask and substrate stages, and the projection lens assembly, and ensures that the mask and substrate stages are focused and aligned appropriately with respect to the projection lens assembly at all times, that the mask and substrate stages perform the scan and repeat movements with the desired synchronism, and that the illumination system maintains the desired illumination characteristics throughout the exposure of the entire substrate.

In large area lithography it is often necessary to expose the same pattern onto different areas, called modules, of a substrate. The first module is exposed by scanning the mask and the substrate as described above. After the exposure is complete, it is then necessary to align the second module area with the mask to reproduce the same pattern on the second module. This can be done by moving only the substrate—also referred to as indexing the substrate—so that the second area is in the patterning region of the projection lens of the lithography system. Indexing the substrate implies that the substrate stage must move the substrate by an amount equal to the size of the module width or length.

In the exposure process described above, the substrate stage must have a range of travel that is large enough to cover the module area in order to scan the substrate in unison with the mask stage during exposure. In addition, to index the substrate from one module area to the next, the substrate stage must also have a range of travel that is large enough to index to all of the module areas and scan or step with the appropriate precision to expose all of the areas of the substrate.

One of the inventors, K. Jain, has previously patented a variety of large-area patterning systems (U.S. Pat. Nos. 4,924,257; 5,285,236 and 5,291,240). These previous patents disclosed projection imaging apparatus for producing very high-resolution patterns for integrated-circuit fabrication on a silicon-wafer-size (a few tens of sq. inches) substrate using reduction patterning with a mask that is larger than an individual integrated circuit, and apparatus for producing patterns on a large, display-panel-size (a few hundred sq. inches) substrate using 1:1 patterning with a mask that is of the same size as the substrate. Due to reasons of economies of scale, there are many other applications, such as multi-chip module fabrication, which would benefit by a high-throughput, 1:1 projection patterning system on a large substrate capable of accommodating multiple modules. However, 1:1 imaging systems require a mask that is of the same size as the substrate. The high cost of large masks is a disadvantage of 1:1 patterning systems.

Thus, it is highly desirable to develop apparatus and method to exploit the benefits of 1:1 large-area projection patterning, using a mask that is significantly smaller than the substrate, which is patterned in modules.

A previous patent application by the same inventor describes such an apparatus, which features an auxiliary stage, to provide repositioning capability for mask or substrate, for sequential 1:1 projection patterning of each substrate module by scanning the mask and substrate simultaneously by a unitary mask-substrate x-y stage. The function of the auxiliary stage is to keep the appropriate part of the mask and/or substrate in the object/image field of view of the projection lens.

These systems require an additional auxiliary stage for indexing the substrate from one exposure area to the next (K Jain, patent pending). Since the indexing stage does not need to move during the exposure, it can be of lower precision and accuracy than the scanning stage; however, it does require that the scanning stage be capable of bearing the extra payload.

This invention frees the size of the substrate panel to be exposed from limitations imposed by the travel range of the scanning stage or the size of the mask. This is accomplished without the use of additional stages or imposing additional requirements on the scanning stage.

Kosugi et al. U.S. Pat. No. 4,775,877, METHOD AND APPARATUS FOR PROCESSING A PLATE-LIKE WORKPIECE, 1988, shows a technique, using a rotatable "hand" for picking up a wafer from a positioning stage, rotating the wafer a half turn, and replacing the wafer on a half-wafer stage for further exposure processing, to double the area of exposure on the wafer.

SUMMARY OF THE INVENTION

Lithography systems that are used for the production of microelectronic devices are very complex machines that require a significant outlay of capital by the manufacturer. These machines use high-precision stages for moving the substrate relative to the imaging system. The cost of the stages can rise exponentially for small increases in the range of travel of the stages. This invention describes a lithography system for exposure of large-area multi-module substrates that uses a single stage whose range of travel is determined by the size of an individual module on the substrate being exposed and not by the size of the entire substrate. This dramatically reduces the cost of the stage as well as the overall footprint of the lithography tool which contributes heavily to utilization costs in a manufacturing plant. This invention also allows the use of a mask whose size requirement is determined by the size of each module on the substrate being exposed and not by the size of the entire substrate. The requirement of producing very large masks is one of the significant barriers to the production of large-area substrates in 1:1 projection lithography tools. Decreasing the mask size makes the manufacturing process more economical and robust.

It is desirable to be able to use a projection lithography tool for exposure of large-area substrates without requiring the use of a scanning stage whose range of travel is determined by the overall dimensions of the substrate. Such a requirement would limit the size of the substrate that could be patterned to a size that could be accommodated by the travel range of the stage. It is also desirable to use a projection lithography tool without requiring the use of additional indexing stages stacked on top of the scanning stage to reposition the substrate for exposure of the different modules. The additional indexing stages not only drive up the cost of the system, but also increase the required load capacity of the scanning stages. It is a specific object of the invention to eliminate the dependence of the maximum substrate size on the range of travel of the scanning stage.

In a projection lithography system it is further desirable to have the capability to pattern a large substrate, consisting of multiple modules in a grid pattern, using a mask containing a single module. The unavailability of high-quality, large-area masks and the technology to manufacture the masks themselves, are real barriers to the manufacturing of electronic modules on large-area substrates. Eliminating the dependency on large-area masks sidesteps these barriers by using smaller masks that are more widely available and more cost-effective. It is a specific object of the invention to provide a projection exposure system for patterning a multi-module substrate, using a mask whose area is determined by the size of each module on the substrate rather than the entire substrate area.

A more specific object of the invention is to provide the capability to pattern different modules of a large substrate by using the precision motion of the scanning stage to bring the next module into the image field of the projection lens. This is accomplished by temporarily immobilizing and isolating the substrate using a substrate docking fixture (SDF) while the scanning stage moves or indexes to position a new module at the imaging region if the substrate holder using the following steps: immobilizing the substrate temporarily by use of the substrate docking fixture; moving the x-y scanning stage under the docked substrate to a predetermined new docking location; affixing the substrate to the x-y stage at the new position; and processing the next substrate module.

A feature of the invention is the incorporation of a substrate docking fixture (SDF) which temporarily immobilizes and isolates the substrate while the scanning stage is indexed to place a newly selected substrate module at the image field location for patterning. The hardware and method described in this invention can also be used to expose many modules of a continuous roll of substrate material.

An advantage of the invention is its applicability to many kinds of projection lithography tools. It may be used with projection systems that use separate stages for the mask and for the substrate as well as with systems that use a single stage for holding both the mask and substrate. For both of these categories, it provides all of the advantages of removing the size limitations imposed by the substrate on the size of the mask and on the range of travel of the scanning stage.

Another advantage of the invention is its economy: a substrate docking fixture (SDF) costs less than an auxiliary indexing x-y stage or a primary x-y stage with a range of travel large enough to accommodate the entire substrate. Note that the essential hardware for the SDF may already be present in a production lithography machine in the form of an automatic substrate handler, and may serve the new functions of this invention with minimum modification. Most lithography tools are equipped with an automatic substrate handler that is used for placing the substrate on the tool for exposure and removing it once the exposure is complete.

Another advantage of the invention is that different masks may be used to image different patterns on the different modules of the same substrate. This is accomplished by using an automatic mask handler to change masks between exposures of the different modules of the substrate.

Other objects, features and advantages of the invention will be apparent to those skilled in the art upon reading the following text and viewing the following figures.

DETAILED DESCRIPTION OF THE EMBODIMENTS

Figure 1:
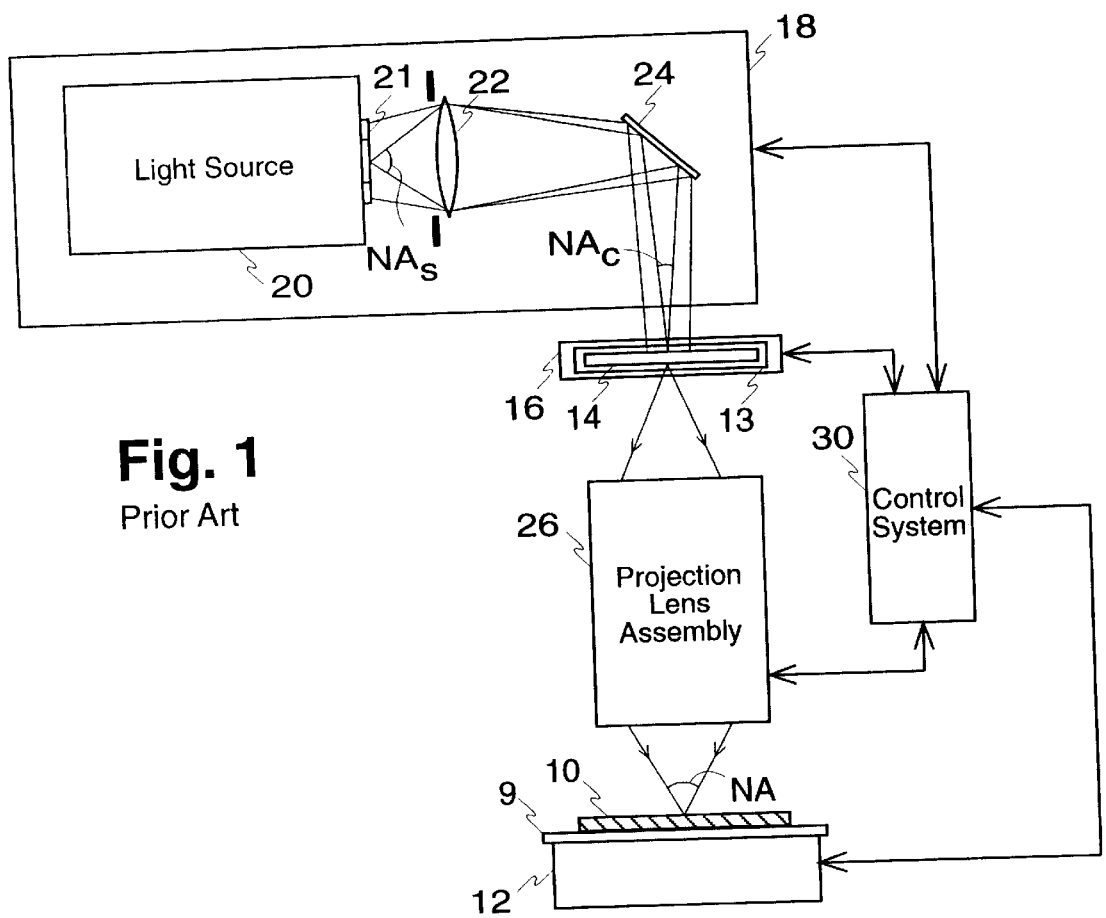
FIG. 1 is a schematic illustration of a prior art lithography tool that shows a mask 14 and a substrate 10 mounted on different stages which move in opposite directions during patterning. For this system the size of the substrate is limited by the scanning range of the substrate stage subsystem.
Figure 2:
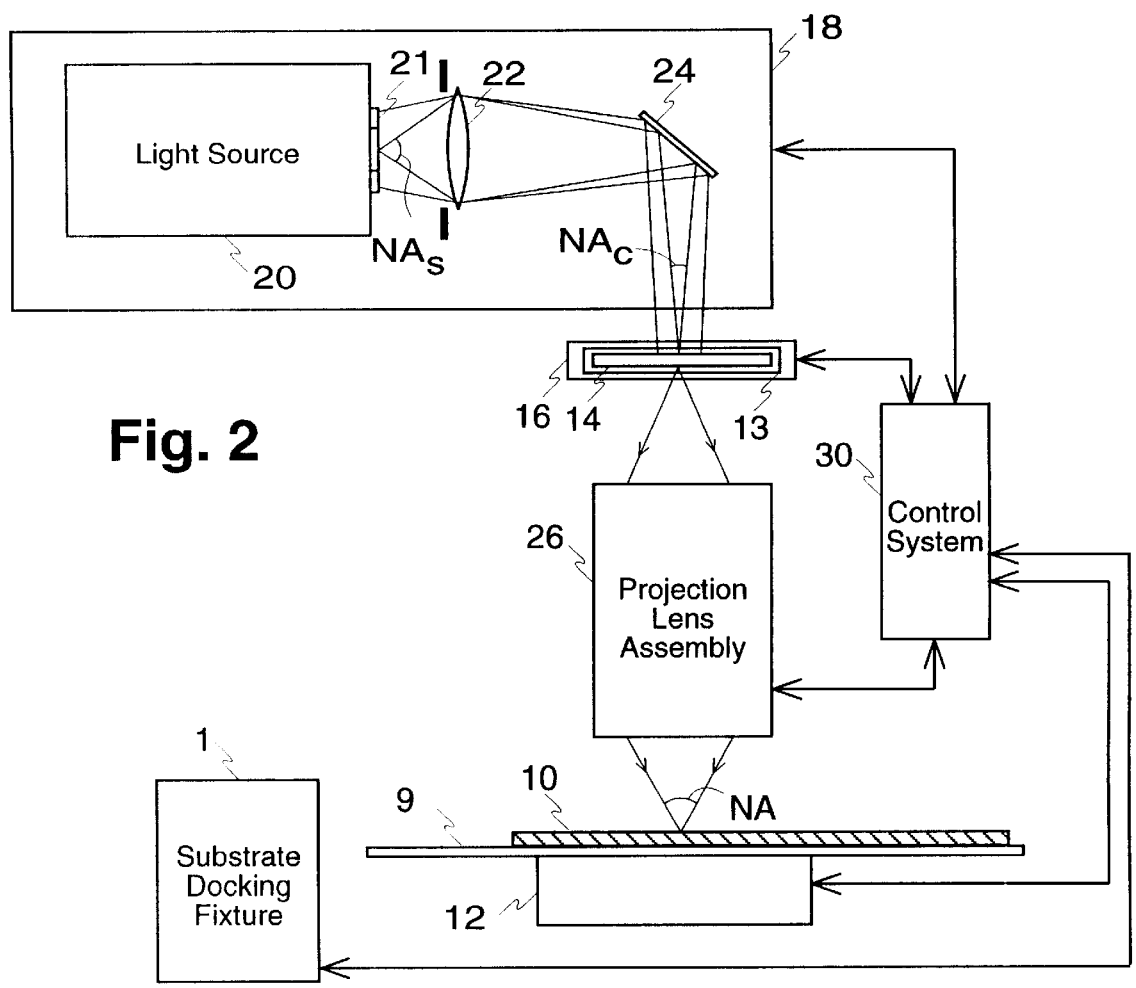
FIG. 2 is a schematic illustration of the first preferred embodiment which is similar to the lithography tool shown in FIG. 1 but includes the addition of a substrate docking fixture (SDF) 1 and appropriate controls.

FIGS. 1 and 2 portray a scanning projection lithography system and illustrate how such a system is used to transfer the pattern from the mask 14 onto the substrate 10 to expose a single module. A module can take up either the entire substrate, or only a portion of the substrate. The substrate 10 and the mask 14 are held rigidly in a substrate stage 12 and a mask stage 16, respectively. Both the substrate stage 12 and the mask stage 16 move synchronously in opposite directions with fine precision. The illumination system 18 consists of a light source 20, an aperture 21, a relay lens 22, and beam steering optics 24. The relay lens collects radiation emitted from the effective emission plane into a certain numerical aperture, $NA_S$, and directs it with a certain magnification and numerical aperture, $NA_C$, to the mask 14. A projection lens assembly 26, which may consist of several individual lens elements and prisms or mirrors, forms an accurate image of the high-resolution pattern contained within the illuminated region on the mask 14 onto the substrate 10. The projection lens has a numerical aperture NA determined by the resolution requirements of the patterning system and is designed for as large an image field as possible.

The substrate stage 12 scans the substrate across its exposure region so as to traverse the length of the module in the direction of the scan. Simultaneously, the mask stage scans the mask across the illuminated region. After completion of a scan, both stages move in a direction orthogonal to the scan direction by an amount termed the 'effective scan width'. Following such a lateral movement, a new scan is generated by precise movements of the substrate and mask stages in the same manner as before. The above exposure process is repeated until the entire module is exposed. The projection assembly also incorporates an automatic focus system. A control system 30 is functionally coupled to the illumination system 18, the mask and substrate stages, 16 & 12, and the projection lens assembly 26. It ensures that the mask and substrate stages are focused and aligned appropriately with respect to the projection lens assembly at all times, that the mask and substrate stages perform the scan and repeat movements with the desired synchronism, and that the illumination system maintains the desired illumination characteristics throughout the exposure of the entire module.

If the substrate is made up of several modules, each module must be exposed with a corresponding pattern on the mask. This is accomplished in prior-art systems by either (a) using a mask as large as the full substrate and scanning the full substrate and mask together, or (b) using one or more auxiliary stages on top of the scanning stages to sequentially position a different substrate module in the image field of the projection lens of the lithography system. These prior-art systems have the disadvantage that they require the scanning stages to have a travel range as large as the full substrate and may also require the mask to be as large as the full substrate. This invention eliminates both of these above disadvantages, i.e., it enables patterning of all the modules using a mask which is of the size of one module, and also using a scanning stage whose travel range is determined by the size of one module rather than the entire substrate. Most important in this invention, as shown in FIG. 2, the control system 30 synchronizes the action of the substrate docking fixture 1, the substrate stage 12, and the holding means on the scanning platform 9.

FIG. 2 shows a projection lithography system equipped with a substrate docking fixture (SDF) 1. The SDF immobilizes the substrate 10 temporarily while the substrate stage 12 moves to a new location to position the next module on the substrate. The substrate is repositioned on the scanning platform 9 so that the travel of the stage allows the next module to be patterned by the lithography tool.

We will now describe the sequence of steps required to expose all of the modules of the substrate using the system in the first embodiment. For this description we will assume that the substrate is partitioned into four modules, each of which is nominally equal in size to the mask size. We will show how one may perform the exposure using a stage with a travel range determined by the size of one module and not by the size of the entire substrate. This is achieved by repositioning the substrate between exposures which enables each module to be patterned by positioning it within the image field of the projection lens of the lithography tool.

Figure 3:
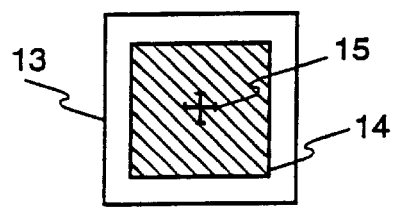
FIGS. 3(a)–3(e) show an overhead view of the platform 13 that holds the mask 14 and the platform 9 that holds the substrate 10. The mask and substrate are mounted to the top of their respective stages as given in the first embodiment of FIG. 2.
Figure 3:
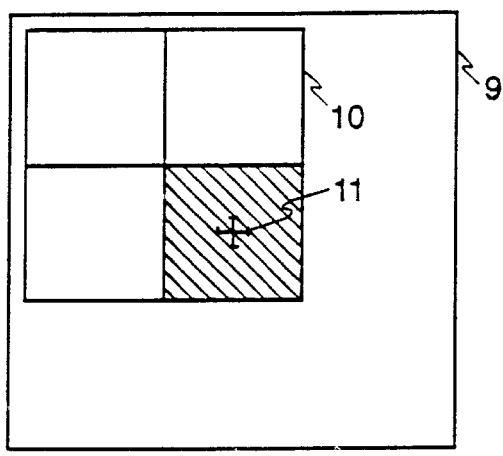
Figure 3:
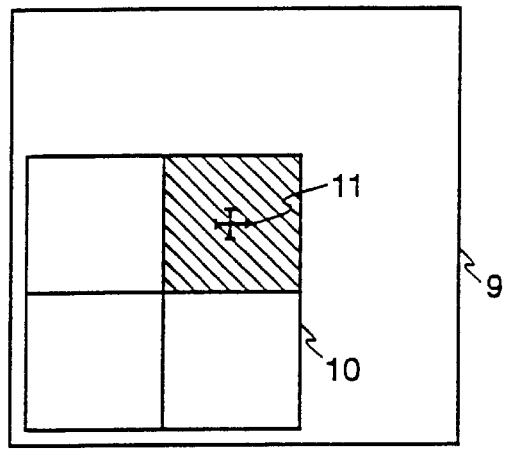
Figure 3:
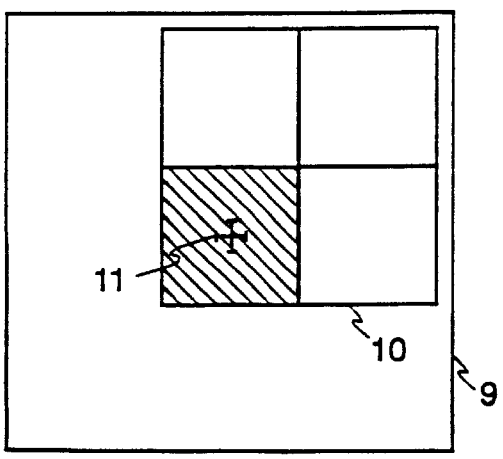
Figure 3:
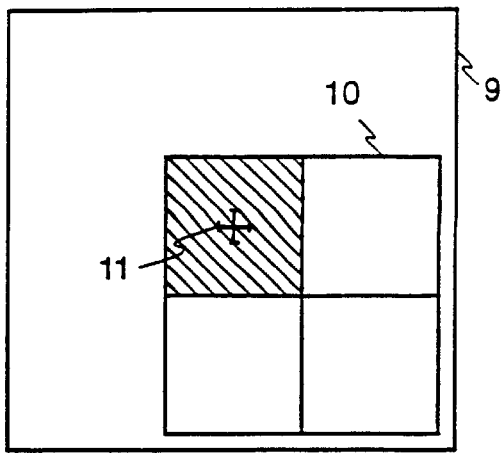

FIGS. 3(a)–3(e) show an overhead view of the platform 13 that holds the mask 14 (FIG. 3(a)) and the platform 9 that holds the substrate 10 (FIGS. 3(b)–3(e)). The substrate 10 is shown divided into four modules. Each platform is mounted to the top of its respective stage. The location of the center of the object field 15 of the projection lens of the lithography tool is shown with respect to the mask platform 13 in FIG. 3(a) when the mask stage is positioned at the center of its range of travel for both the x and y axes; similarly, the location of the center of the image field 11 of the same projection lens is shown with respect to the substrate platform 9 in FIGS. 3(b)–3(e) when the stage is positioned at the center of its range of travel for both the x and y axes. FIGS. 3(b)–3(e) show the four possible locations of the substrate 10 on the substrate holding platform 9 so that each module can be patterned by the image field of the projection lens.

The substrate holding platform 9 must be large enough to accommodate all of the possible substrate positions that are needed to bring each module into the image field 11 of the projection lens. This platform 9 is larger than is required in the prior art as shown in FIG. 2, but the travel range of the stage 12 is smaller. The substrate platform 9 is capable of holding the substrate during the exposure process regardless of the location of the substrate on the platform 9. This can be accomplished, for example, through the integration of a vacuum chuck into the scanning platform with multiple vacuum zones that can be activated as needed. In this way, the appropriate zone can be activated to hold the substrate at the correct position on the platform.

Figure 4:
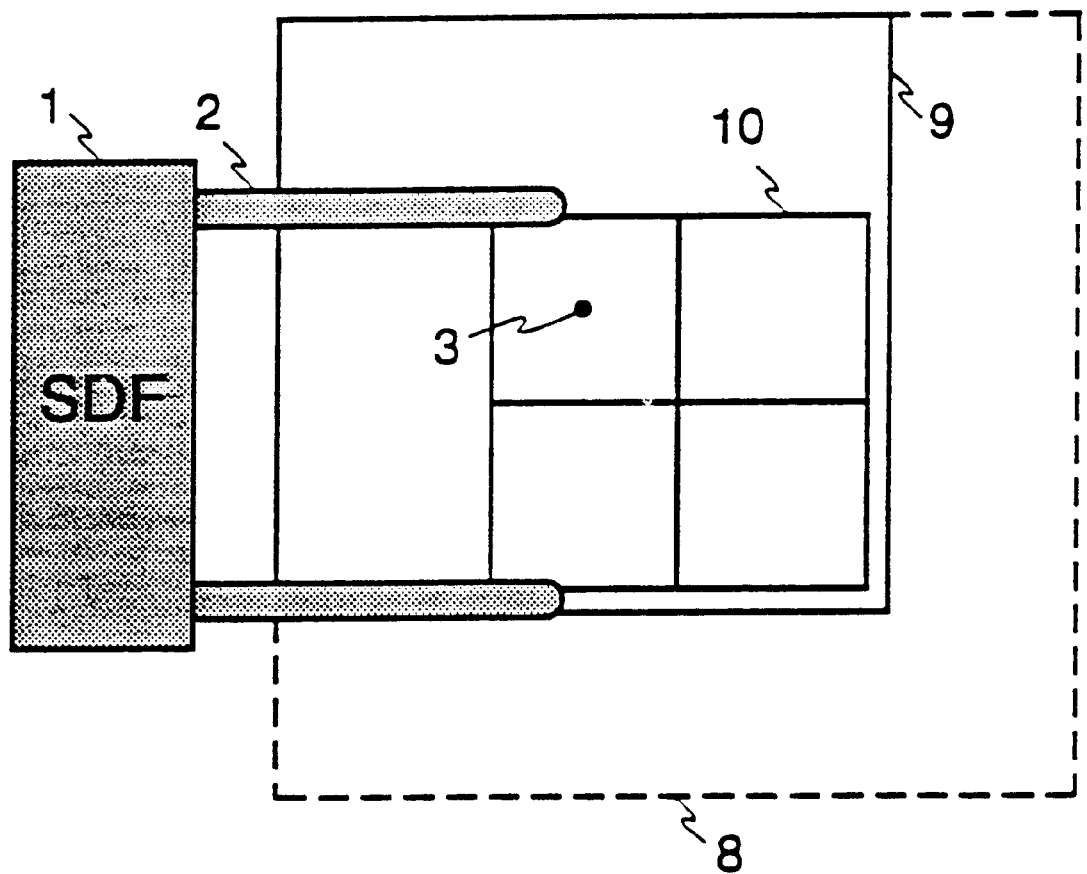
FIG. 4 shows the entire travel envelope 8 of the substrate platform 9 of the first embodiment, and a schematic of the substrate docking fixture SDF 1.

FIG. 4 shows the entire travel envelope 8 of the substrate holding platform 9 for the first embodiment and a schematic representation of the substrate docking fixture (SDF) 1. The function of the SDF is to immobilize and isolate the substrate while the stage indexes to the next location to bring the next substrate module into the image field of the projection lens. The SDF can have one or more arms or pins 2 that hold and immobilize the substrate during the indexing of the stage. The stage is oriented so that the next module to be exposed is positioned over the center 3 of the substrate holding platform 9. This automatically positions the module such that, when the stage is in the middle of its range of travel, the image field of the projection lens is centered on the module to be exposed. After the indexing is complete, the SDF releases the substrate, the holding means of the substrate platform are activated, and the substrate module thus positioned is exposed. During the exposure of the module, the arms of the SDF are retracted so that it does not interfere with the exposing procedure.

It is an advantage of this invention that the functions of the SDF can be performed by an automated substrate handler. An automatic handler is typically used to place an unexposed substrate on the patterning tool for exposure and to remove it once exposure is complete. These actions are similar to the functions of the SDF so that, with minimal modifications, it can be used to immobilize the substrate 10 while the substrate stage 12 is indexed to bring the next module into the image field of the projection lens. This feature of the invention enables substantial cost-savings in implementation of all of the embodiments of this invention.

There are a number of methods by which the SDF can immobilize the substrate. If the SDF also serves as the automated substrate handler, then the substrate can be immobilized simply by lifting the substrate from the holding platform while the latter indexes to the new position. Some substrate holding platforms use retractable pins in the vacuum chuck under the substrate. When the substrate is ready to be removed, the vacuum is disabled and the pins are extended; this lifts the substrate off the chuck and allows room for the substrate handler to come underneath the substrate and lift it from the platform. Thus, if the SDF also serves as the automated substrate handler, the SDF can lift the substrate off the pins to allow the stage to index, and then place the substrate back on the pins. After the pins lower the substrate back down to the holding platform, the vacuum is enabled, and the next module is ready for exposure.

Another technique for immobilizing the substrate uses a substrate docking fixture 1 which has pins 2 that reference off the edge of the substrate 10 from above as shown in FIGS. 5(a)–5(d). During the exposure, the SDF is retracted so that it does not interfere with the illumination or with the scanning. After the exposure of a module is complete, the scanning platform moves to a docking location as shown in FIG. 5(a) which brings the substrate 10 under the SDF. The SDF moves down so that the pins 2 prevent the substrate from moving horizontally as shown in FIG. 5(b). The vacuum under the substrate is now turned off and the holding platform is indexed to the next location as shown in FIG. 5(c) while the pins 2 prevent movement of the substrate 10. A more sophisticated refinement of this embodiment may use an air-bearing to float the substrate while the stage is being indexed. After the stage has indexed, the vacuum is re-enabled and the SDF retracts as shown in FIG. 5(d), leaving the substrate in a new position so that the next module can be exposed.

We show in FIG. 4 the substrate holding platform 9 (and hence the stage 12) at one corner of its range of travel. For the example in which the substrate 10 is partitioned into four modules, the stage position shown is one of the four possible docking locations. A docking location is defined as the stage position at which the substrate docking fixture (SDF) either seizes or releases the substrate. The travel envelope 8 for the substrate holding platform 9 that is necessary to bring the next module into the image field of the projection lens 26 is determined by the size of the substrate module. The module of the substrate 10 that lies over the center 3 of the platform 9 falls in the image field of the projection lens.

FIGS. 6(a)–6(d) show all four of the docking locations of the stage for the example in which the substrate is partitioned into four modules. The four docking locations are at the extreme positions for the x-y range of travel. For each docking location shown, a different module of the substrate 10 is positioned over the center 3 of the substrate holding platform 9, so that each module can be patterned in turn.

Next, we describe the sequence of events that allows the entire substrate to be patterned using a range of travel determined by the size of one module and not the size of the entire substrate. The stage is positioned to accept a substrate from the automated substrate handler whose function is to transfer a blank substrate from a cassette on the manufacturing floor to the lithography tool for exposure. This stage position is shown in FIG. 6(a) and is referred to as the first docking position. The automated substrate handler, which could be the same as the SDF 1, places the substrate 10 on the substrate holding platform 9. The holding means of the platform 9 (e.g., vacuum) are activated so that the substrate cannot move with respect to the platform. The module positioned over the center 3 of the substrate holding platform 9 will be the first module (M1) to be patterned during the exposure.

When the patterning of the first module (M1) of the substrate is complete, the stage moves back to its first docking location. At this point the substrate holding means are disabled, and the SDF immobilizes the substrate so that the stage can index to the second docking location. This brings the second module (M2) of the substrate into the image field of the lens as shown in FIG. 6(b). Note that the first module (M1) has already been patterned, and the next module (M2) is now positioned over the center 3 of the substrate holding platform 9. The SDF 1 then releases the substrate and the holding means of the platform are activated, so that the second module can be patterned by the tool. When the exposure of the second module (M2) is complete, the stage returns to the second docking location so that the SDF can immobilize the substrate to allow the stage to index to the third docking location. The third docking location is shown in FIG. 6(c). Note that the first two modules have been patterned and the third module (M3) is positioned in the image field of the projection lens. The exposure process is repeated a third time, and FIG. 6(d) shows the platform 9 and the substrate 10 after the stage has indexed to its fourth docking location. Once the exposure of the fourth and last module (M4) is complete, the automated substrate handler removes the exposed panel, and a new blank substrate is loaded. The entire sequence can now be repeated to expose the new substrate.

It is an advantage of this invention that different masks can be used to expose the different modules of the same substrate. This can be accomplished through the use of an automated mask handling system that changes the mask between exposures of the different modules. This is desirable for those situations in which it is necessary to generate different modules on the same substrate.

FIGS. 3(a)–3(e), 4, 5(a)–5(d), and 6(a)–6(d) described the hardware and procedure for exposing a four-module substrate. As another example FIGS. 7(a)–7(b) illustrate the patterning of a substrate 10 that is partitioned into nine equal-sized modules. The first module to be exposed is, again, positioned over the center 3 of the substrate holding platform 9. The required travel envelope 8 of the platform 9 is determined by the size of the modules.

It is important to note that, for this example, there are still only four docking positions for the substrate holding platform 9. Since there are more modules than docking positions, the procedure for exposing the substrate is slightly different though all the hardware remains essentially the same. The substrate is shown loaded at its first docking position in FIG. 7(a). After the exposure of the first module (M1) is complete, the stage returns to its first docking position, the SDF 1 immobilizes the substrate 10, the platform 9 holding means are disabled, and the stage indexes to its second docking position to locate the second module (M2) over the center 3 of the substrate holding platform 9 as shown in FIG. 7(b). After the second module (M2) is exposed, the stage returns to the first docking position as shown in FIG. 7(c), and the substrate is again immobilized. Note that the position of the substrate relative to the substrate docking fixture, SDF, is now different from that in FIG. 7(b). The stage now indexes to the second docking position as shown in FIG. 7(d). This positions the third module (M3) for patterning. Note that in FIGS. 7(a)–7(d), the SDF is schematically shown as a comb-like set of "fingers" on which the substrate may be held by vacuum means, as an example.

For substrates containing more than three modules in the first row, the subsequent modules could be positioned by repeating the above procedure; namely, immobilizing the substrate at the first docking position, and indexing the substrate to the second docking position. This procedure may be repeated, without patterning, as required, to correctly position any desired substrate module without processing of intermediate modules.

To advance the substrate 10 along a column of modules, FIG. 8(a) shows the first module (M1) positioned over the center 3 of the substrate holding platform 9. Once the module M1 is exposed, the substrate is immobilized by the SDF at the first docking station, and the stage indexes to the third docking station shown in FIG. 8(b). This brings the module M4 into the imaging location so that module M4 can be patterned. This process can be repeated again to bring the third module (M7) of the first column over the center 3 of the platform 9 as shown in FIG. 8(c). If the substrate contained more than three modules in the first column, the subsequent modules would be positioned by repeating the above procedure; namely, by immobilizing the substrate at the first docking position, and indexing the substrate to the third docking location. By repeating similar sequences of steps, all the modules in columns 2, 3, . . . etc. can be patterned.

It is also possible to advance the substrate diagonally, to change both the row and column being exposed with one indexing step. FIG. 9(a) shows the first module (M1) positioned over the center 3 of the substrate holding platform 9. Once the first module is exposed, the substrate is immobilized by the SDF at the first docking position, and the stage indexes to the fourth docking position shown in FIG. 9(b), which positions the module M5 for patterning. This sequence of steps can be repeated indefinitely to continue advancing the substrate along the diagonal. There are many other combinations of docking locations that can be used to advance the substrate along different directions. These will be apparent to those skilled in the art.

Figure 5:
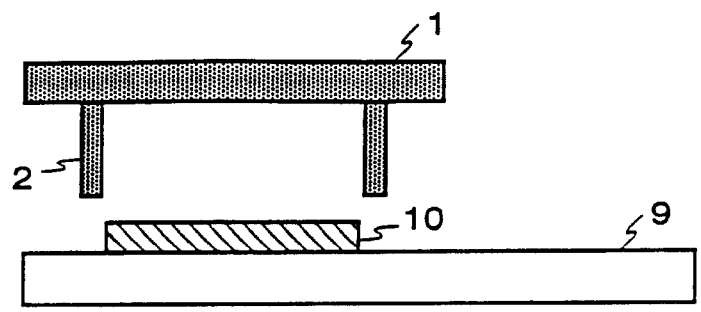
FIGS. 5(a)–5(d) show an embodiment of the SDF 1 in which pins are used to hold the substrate fixed while the stage indexes to the next docking location.
Figure 5:
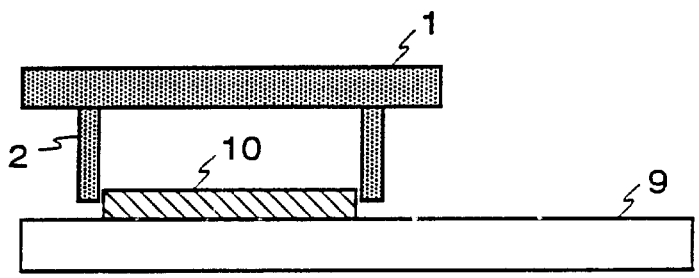
Figure 5:
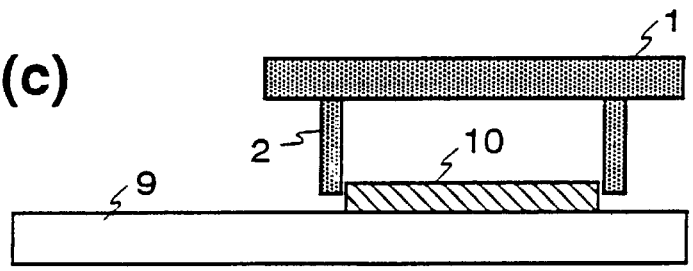
Figure 5:
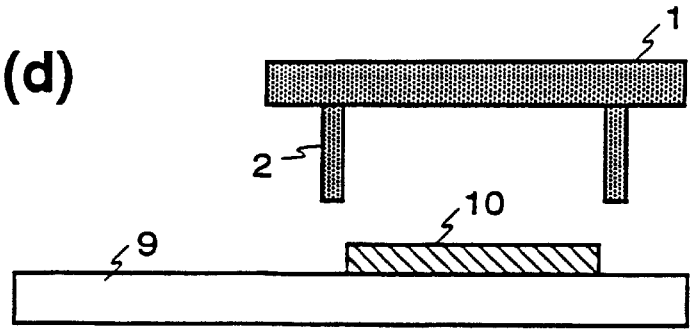
Figure 6:
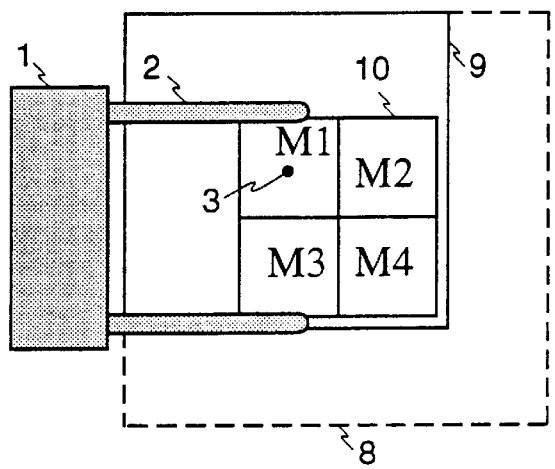
FIGS. 6(a)–6(d) show the four docking positions of the substrate platform 9 for the case in which the substrate is partitioned into four modules. It also shows the different substrate orientations required to expose all of the modules.
Figure 6:
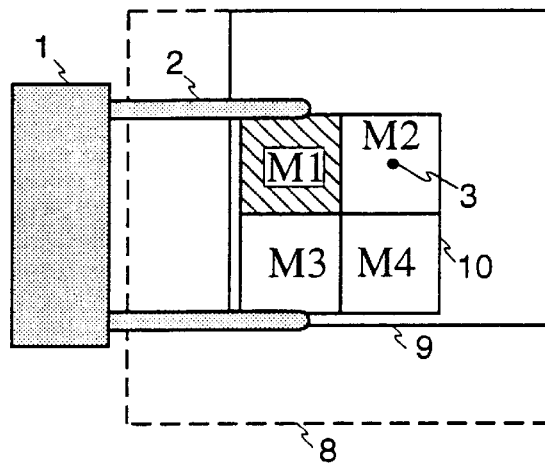
Figure 6:
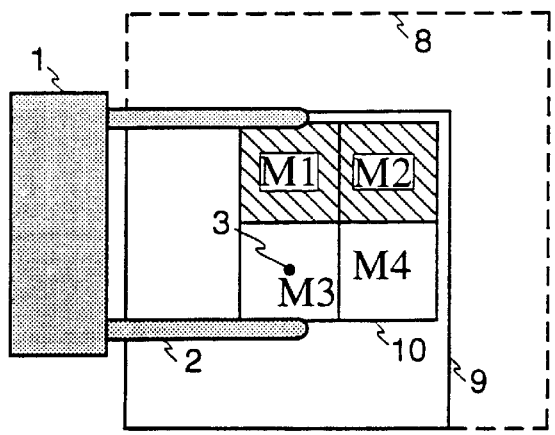
Figure 6:
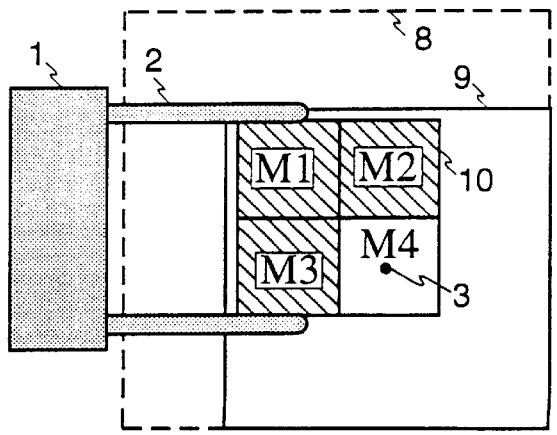
Figure 7:
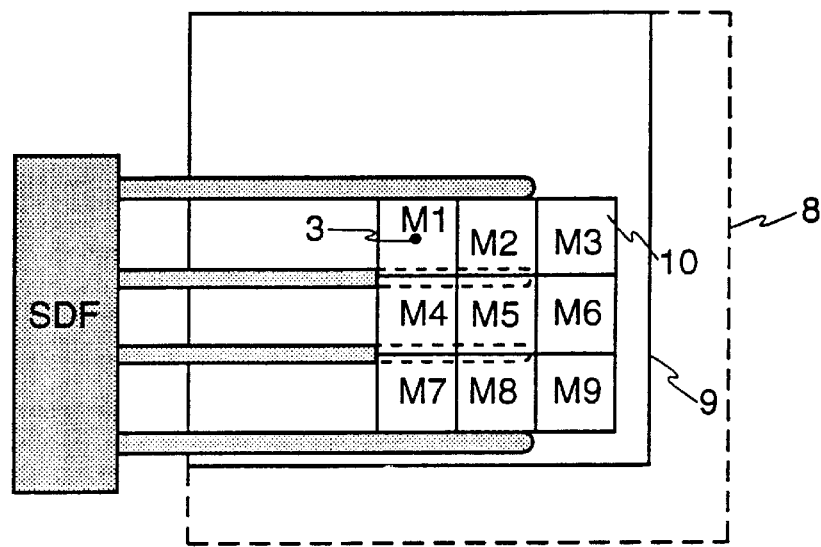
FIGS. 7(a)–7(d), 8(a)–8(c), and 9(a)–9(b) show the different sequences of the docking positions of the stage for the case in which the substrate is partitioned into nine modules, and they show the different substrate positions to expose some of the modules.
Figure 7:
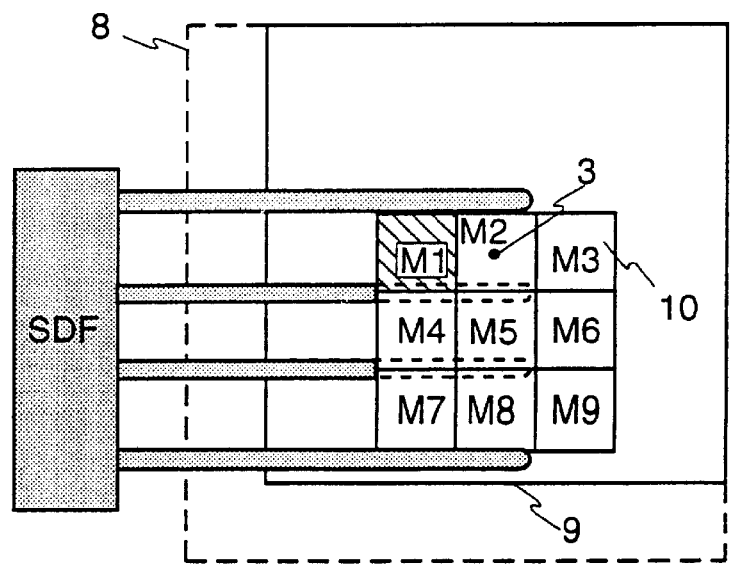
Figure 7:
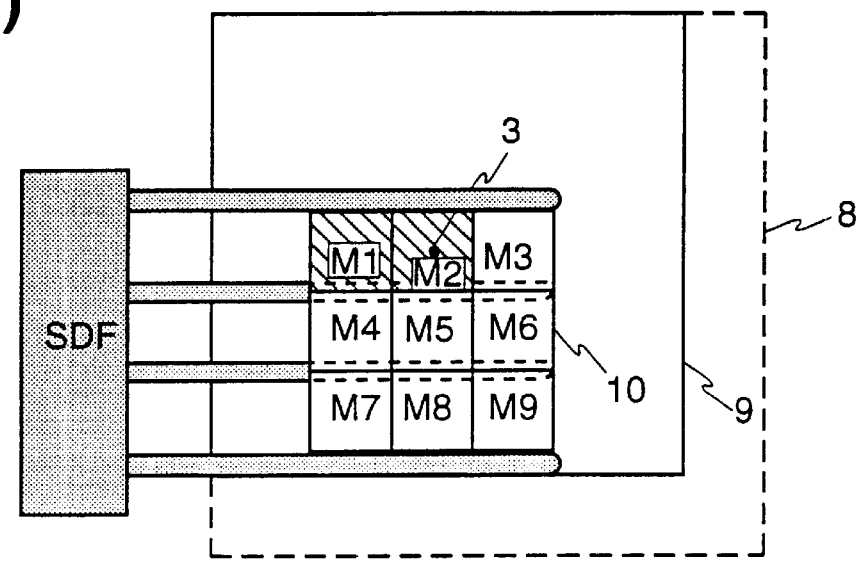
Figure 7:
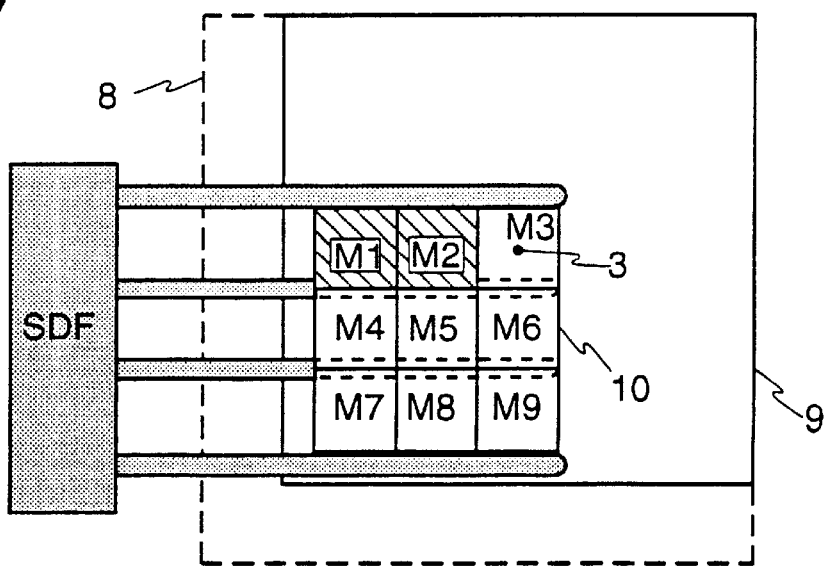
Figure 8:
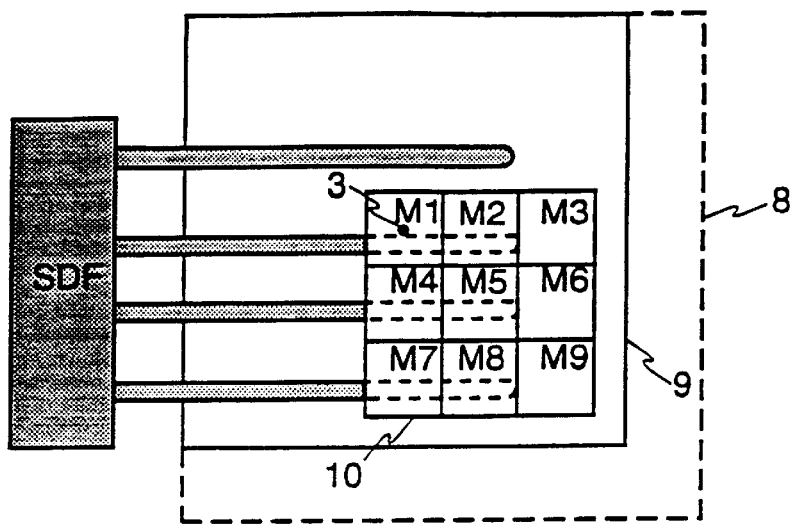
Figure 8:
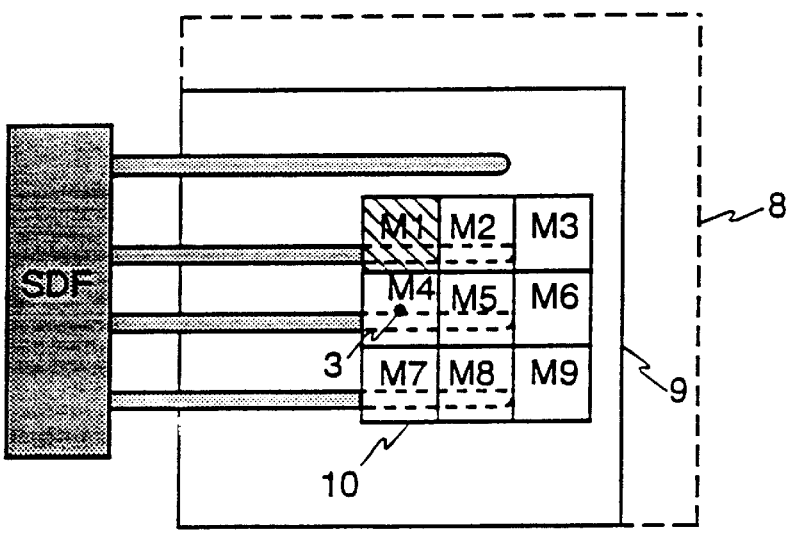
Figure 8:
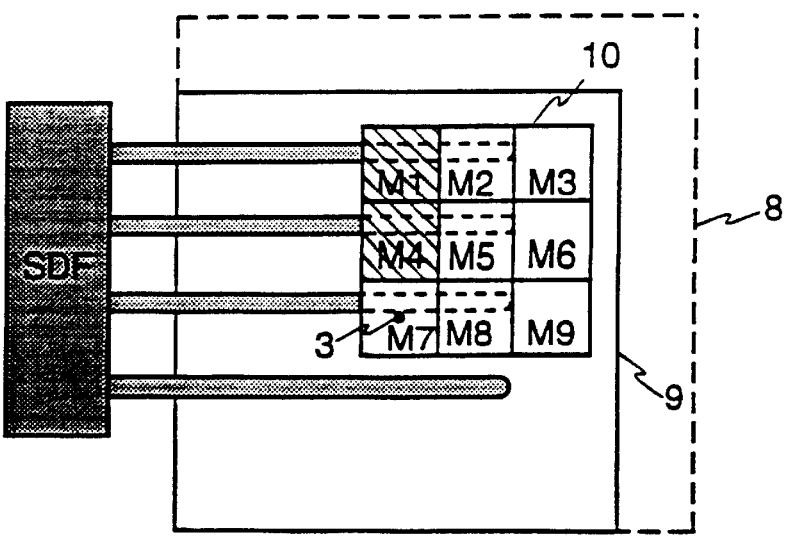
Figure 9:
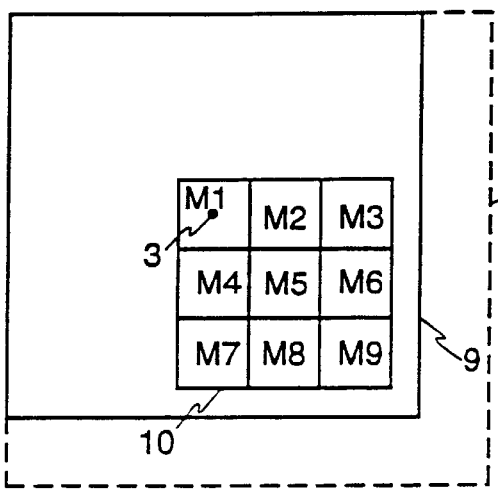
Figure 9:
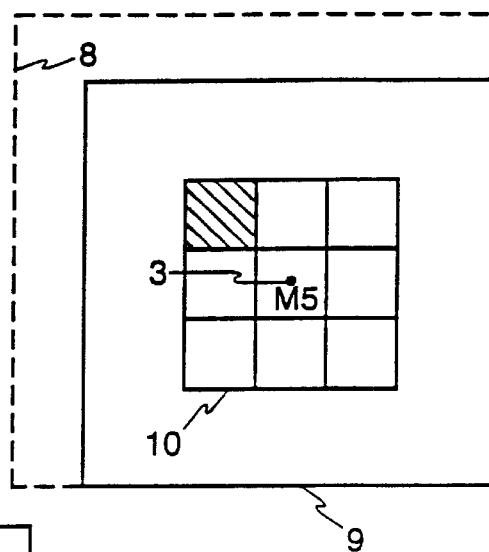

A key differentiation between the embodiments of FIGS. 4–6 and those of FIGS. 7–9 must be noted. In FIGS. 4–6 the stage presents the substrate 10 to the SDF 1 at the same orientation and position at each docking location. Whenever the SDF seizes the substrate 10, the latter is always immobilized by being contacted at the same contact points. This is an advantage of the invention for the example in which the substrate is partitioned into four or fewer modules. In contrast, in FIGS. 7–9, the stage presents the substrate 10 to the SDF at a different position at the first docking location depending on which module of the substrate is to be patterned. For most applications this does not present a problem. Indeed, by using a vacuum-gripping, comb-like SDF of the type shown in FIGS. 7 and 8, the substrate can be easily contacted at different points and immobilized. For those applications in which it is necessary for the SDF to hold the substrate at the same contact points each time the substrate is indexed, the SDF can be repositioned. This can be accomplished by adding linear translational capability to the SDF (e.g., by additional stages). The SDF would translate in x and in y so that it always immobilizes the substrate at the same contact points. In some cases, the SDF may already have such translational capabilities included in order to serve its function as an automated substrate handler.

Using the above approaches it is possible to expose any module of a substrate that has been partitioned into an array of N×M modules where N is the number of columns and M is the number of rows.

For some applications it is cost-effective to use a continuous roll of web (flexible) material as the substrate rather than a discrete, rigid substrate. The web material could be partitioned into 1×M panels where M could number in the hundreds or thousands. One of the co-inventors of this patent application, K. Jain, has described in a previous patent application, Ser. No. 08/506,232, filed Jul. 24, 1995, allowed Feb. 3, 1997, how to perform continuous seamless scanning exposures of a single panel on the web. The aforementioned patent application also describes how the web could be advanced using automated rollers to bring the next panel into the imaging region of the projection lens.

Figure 10:
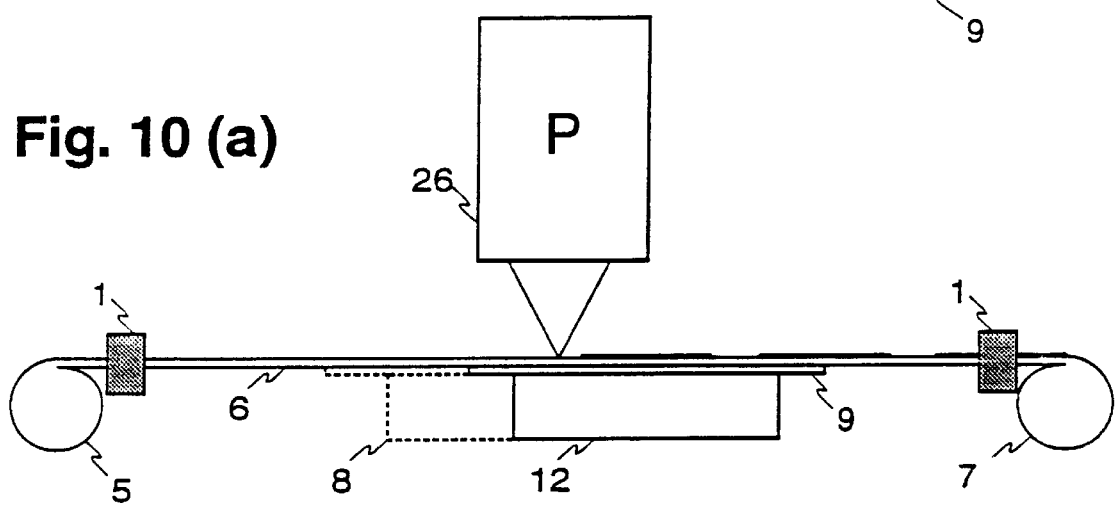
FIGS. 10(a)–10(b) illustrates how the same hardware and method can be used to advance a continuous roll of substrate material from one exposure module to the next.
Figure 10:
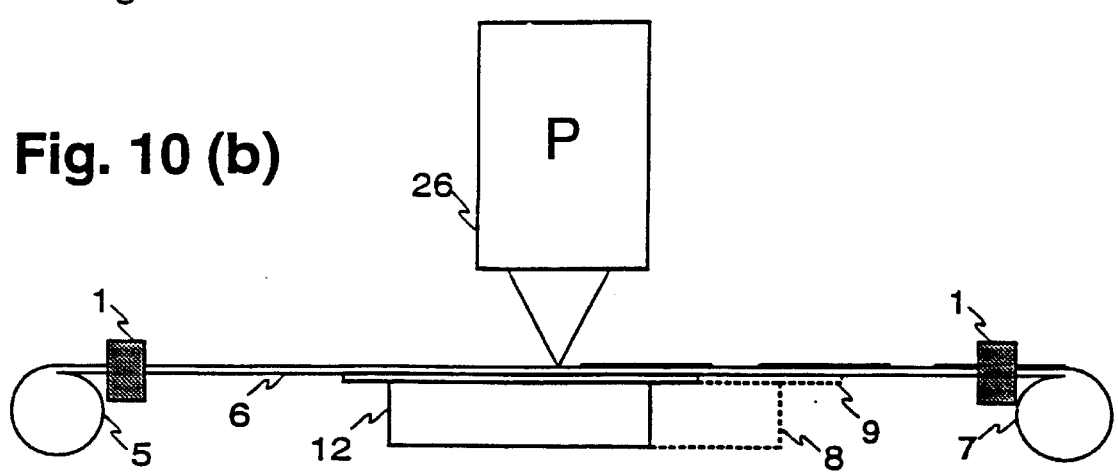

Since each panel on the web material can consist of one or more modules, the present invention may be used to pattern each module. Such an embodiment of this invention is shown in FIG. 10, where the use of a substrate docking fixture 1 and the indexing of the stage 12 is used to advance the continuous roll of substrate material 6 in a more accurate and cost-effective manner. The above-referenced previous invention by Jain describes how the unpatterned web material is played out by the roller 5, and traverses the scanning platform 9. During exposure the web material is held down to the scanning platform through means such as vacuum or edge clamps. The web continues across to the roller 7 which holds the web material that has already been patterned. We will not describe in detail how the scanning exposure is accomplished since this is already covered in the referenced invention by Jain.

The technique of the present invention, as described in FIGS. 6–9, can be extended to the web material shown in FIG. 10. Once the patterning of a module on a panel is complete, the stage moves to the docking position shown in FIG. 10(a) at the end of its range of travel 8. The rollers 5 and 7 are used to remove any slack in the web between the substrate holding platform 9 and the rollers. The web material 6 is released from the holding means on the platform and seized by the substrate docking fixture 1. The stage is then free to advance to the second docking position shown in FIG. 10(b) at the other end of its range of travel 8. At this point, the substrate material 6 is fixed on the substrate holding platform 9, as before, while the SDF 1 releases the web. The system is now ready to expose the next module of the substrate.

This technique of web advancement exploits the accuracy and precision that is already present in the substrate stage 12. It can therefore also be used to advance the web by a full panel at a time. Thus, in addition to enabling patterning of multiple modules on a panel, this embodiment also removes the requirement of high-precision motors on the rollers which are used to advance the substrate in prior art.

Figure 11:
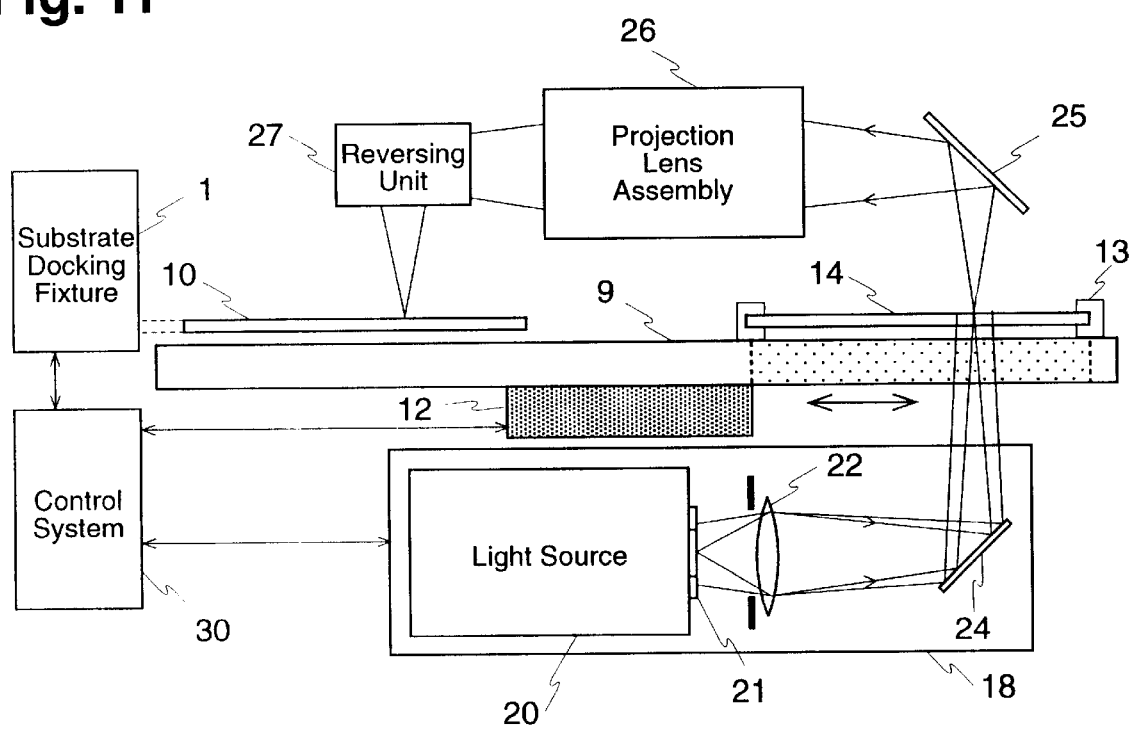
FIG. 11 shows another embodiment of the invention in which the mask and the substrate are mounted on a single planar scanning stage.

FIG. 11 shows another embodiment of the invention for a type of lithography tool in which the mask 14 and substrate 10 are fixed with respect to each other and are mounted side-by-side on a single platform 9. As the stage 12 scans, both the substrate 10 and the mask 14 move together in synchronism. As in FIGS. 1 and 2, the illumination system 18 consists of a source system 20, a relay lens 22, and beam steering optics 24. The relay lens collects radiation into a certain numerical aperture from the effective emission plane and directs it with a certain magnification and numerical aperture onto the mask 14. A projection lens assembly 26, which may consist of several individual lens elements and prisms or mirrors, forms a precise image of the high-resolution pattern contained within the illuminated region on the mask on to the substrate. The projection lens has a 1:1 magnification ratio and has a numerical aperture NA determined by the resolution requirements of the patterning system. It is designed for as large a circular image field as possible. The fold mirror 25 and the reversing unit 27 fold the imaging path and ensure that the image is in the same orientation as the object. The control system 30 synchronizes the action of the substrate docking fixture 1, the stage 12, and the holding means on the platform 9.

The single planar stage allows the mask 14 and the substrate 10 to scan in unison (say, along the x-axis) across their respective illumination regions to traverse the substrate length. Following a scan, the stage moves along y by an amount called the effective scan width. Now the substrate and mask are again scanned along x as before, after which they are laterally moved along y, and the process is repeated until the entire substrate is exposed.

As described so far, the embodiment of FIG. 11 is similar to an invention by one of the co-inventors, K Jain, as described in U.S. Pat. No. 5,285,236. However, FIG. 11 differs significantly from the prior art in that it enables the patterning of multiple modules on a large substrate with a small-travel stage, whereas the prior-art systems require a full-travel scanning stage and an auxiliary stage for substrate indexing. This invention achieves these functions by incorporating a substrate docking fixture 1 and using the novel method for indexing the substrate as described above, namely, after exposure of a module the substrate is released by the scanning platform and immobilized at a docking location, the stage is indexed to bring the next module into the image field of the projection lens, and the SDF is made to release the substrate while the holding means are enabled so that the next module can be exposed.

The embodiment shown in FIG. 11 is a 1:1 projection lithography tool and requires a mask that is equal in area to the pattern being generated on the substrate. Without this invention, the mask size would have to be roughly equal to the size of the substrate. High-quality, large-area masks are extremely difficult and expensive to manufacture and represent a significant barrier to the realization of high-throughput, low-cost, for large-area lithography. This invention allows the use of a mask whose area is determined only by the size of an individual module being exposed on the substrate, and not by the size of the entire substrate.

Figure 12:
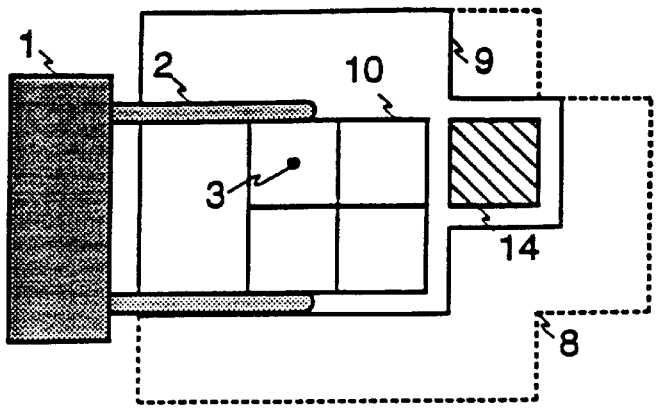
FIGS. 12(a)–12(d) show the four docking positions of the stage for the embodiment of FIG. 11 for the case in which the substrate is partitioned into four modules, and it shows the different substrate positions to expose all of the modules.
Figure 12:
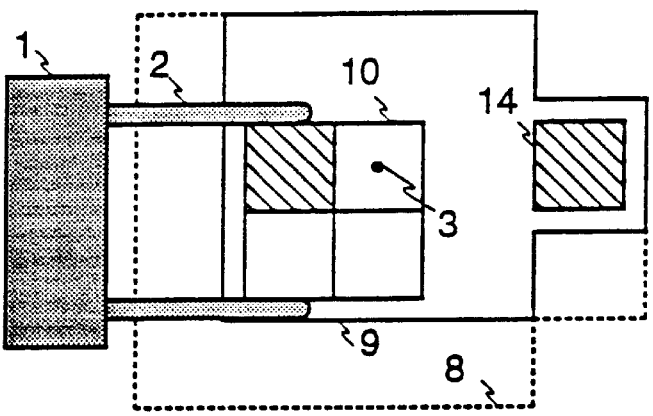
Figure 12:
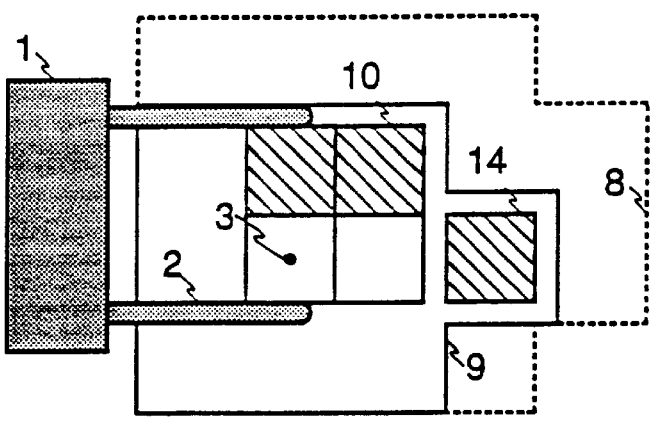
Figure 12:
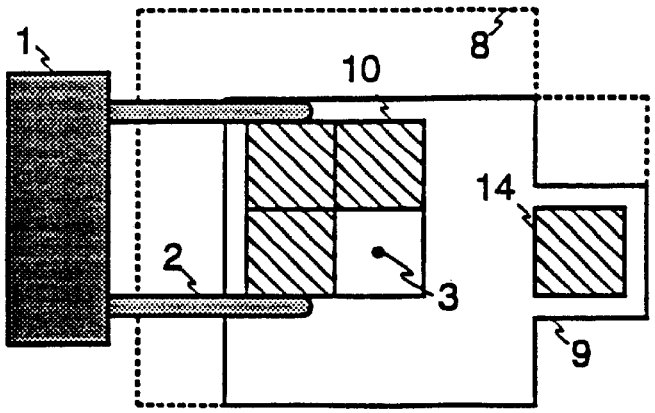

FIG. 12 shows an overhead view of the platform 9 that carries both the mask 14 and the substrate 10. All four of the docking locations are shown for the example in which the substrate is partitioned into four modules and is near the end of its travel for both x and y dimensions. For each docking location shown, a different module of the substrate 10 is positioned over the center 3 of the platform 9 so that each module can be patterned in turn.

The sequence of events in this embodiment to expose a complete substrate is exactly the same as was explained in FIG. 6 for the first embodiment. The only difference between the two embodiments is that in the embodiment of FIG. 12 the platform 9 is larger so that it may accommodate the mask 14 in addition to the substrate 10. This embodiment can also be used to expose substrates that have been partitioned into a smaller or larger number of modules as was described for the first embodiment. It is also possible to use this embodiment to expose a continuous roll of web material in the same manner as described in FIG. 10.

Each of these embodiments offers significant advantages over the hardware and methods that are currently used in prior-art tools. Each frees the size of the substrate panel to be exposed from limitations imposed by the travel range of the scanning stage or the size of the mask.

The substrate docking fixture can be operated in two different ways: it may either grip and immobilize the substrate in the same fixed position with respect to the substrate docking fixture, or it may grip and immobilize the substrate in several different, selectable positions with respect to the substrate docking fixture. In the first case, the number of docking locations of the scanning stage for repositioning the substrate to pattern different modules is the same as the number of modules to be patterned on the substrate. In the latter case, the number of modules that can be patterned on the substrate can be greater than the number of docking positions of the scanning stage.

While the invention has been shown in the form of several embodiments, each with versions and variations, the foregoing and other changes in form and detail will be apparent to those skilled in the art, without departing from the spirit and scope of the invention as described in the following claims:

We claim:

1. A large-area, high-throughput, high-resolution, scan-and-repeat, projection imaging system for replicating patterns present on a mask onto a substrate, which substrate includes a set of substrate modules each corresponding to the mask, including a currently selected substrate module and subsequently selected substrate modules, characterized by:
(a) a scanning stage subsystem (12,16/12) capable of scanning the mask and the substrate in one dimension, and also being capable of moving laterally in a direction perpendicular to the scan direction so as to position itself for another scan; said stage subsystem thus being capable of exposing each full substrate module by configuring each substrate module into a certain number of parallel strips, and exposing each of said strips by scanning the length of the strip across a fixed illumination region;

(b) a substrate holding platform (9), mounted on said stage subsystem (12), for affixing in predetermined relationship to said stage subsystem (12) a substrate (10/6) having a currently selected substrate module and subsequently selected substrate modules;

(c) mask holding means (13), mounted on said stage subsystem (12,16/12), for affixing a mask (20) in predetermined relationship to said stage subsystem (12,16/12);

(d) an illumination subsystem (18) having spectral and intensity characteristics suited for exposure of said substrate (10/6), having an effective source plane of a predetermined shape, and for uniformly illuminating on said mask (14) a region of said predetermined polygonal shape;

(e) a projection subsystem (26/25–27) capable of imaging said illuminated region on the mask onto said currently selected substrate module, and having an image field area smaller than the substrate module area;

(f) a substrate docking fixture (1) capable of temporarily gripping and immobilizing said substrate (10/6) while permitting relative movements between said substrate holding platform (9) and the substrate (10/6) so as to shift the location of the mask image from a currently selected module on said substrate to a subsequently selected substrate module; and (g) control means (30) to operatively interrelate said scanning stage subsystem (12,16/12), said illumination subsystem (18), said substrate holding platform (9) and said substrate docking fixture (1) to provide additive illumination in certain overlap regions of areas exposed by adjacent strip scans of each substrate module such that the effect of the exposure dose delivered in said overlap regions is seamless and the effect of the exposure dose delivered across each entire substrate module is uniform.

2. A projection imaging system according to claim 1, further characterized in that
said illumination subsystem (18) has an effective source plane in the shape of a regular hexagon.

3. A projection imaging system according to claim 1, further characterized in that
said illumination subsystem (18) provides radiation from a mercury lamp.

4. A projection imaging system according to claim 1, further characterized in that
said illumination subsystem (18) provides radiation from an excimer laser.

5. A projection imaging system according to claim 1, further characterized in that:
said scanning stage subsystem capable of scanning the mask and the substrate is a single planar stage (12) on which is mounted a holding platform (9) on which are affixed the substrate (10/6) and the mask (14); and
said projection subsystem (26/25–27) has an imaging ratio which is substantially one-to-one.

6. A projection imaging system according to claim 1, further characterized in that:
said substrate holding platform (9) is capable of holding one panel-section of a substrate that is flexible and continuous.

7. A projection imaging system according to claim 1, further characterized in that:
said substrate docking fixture (1) serves also as an automated substrate handling system.

8. A projection imaging system according to claim 1, further characterized in that:
said substrate docking fixture (1) is movable in the three dimensions x, y and z.

9. A projection imaging system according to claim 1, further characterized in that:
said substrate docking fixture (1) is movable in the three dimensions x, y and z and serves as an automated substrate handling system.

10. A projection imaging system according to claim 1, further characterized in that:
said substrate docking fixture (1) is capable of gripping and immobilizing the substrate (10/6) in a single, fixed positional relationship with respect to the substrate docking fixture (1).

11. A projection imaging system according to claim 1, further characterized in that:
said substrate docking fixture (1) is capable of gripping and immobilizing the substrate (10/6) in multiple, selectable positional relationships with respect to the substrate docking fixture (1).

12. A projection imaging system according to claim 1, further characterized in that:
said scanning stage subsystem capable of scanning the mask and the substrate comprises two separate stages, a mask scanning stage (16) on which is mounted the mask (14) affixed in its holder (13), and a substrate scanning stage (12) on which is mounted the substrate (10) affixed in its holder (9).

13. A projection imaging system according to claim 12, further characterized in that:
said projection subsystem (26) has an imaging ratio which is substantially one-to-one; and
said control means (30) causes said mask scanning stage (16) and said substrate scanning stage (12) to move with substantially equal velocities.

14. A projection imaging system according to claim 12, further characterized in that:
said projection subsystem (26) has an imaging ratio which is substantially N-to-one, N being a number other than 1; and
said control means (30) causes said mask scanning stage (16) and said substrate scanning stage (12) to move with velocities with ratio N-to-one.

15. A high-throughput, high-resolution, projection imaging system for replicating patterns present on a mask onto a substrate which includes a set of substrate modules each corresponding to the mask, which are to be subjected to a patterning image at an image field in which the projection optics project an effectively focused mask image onto at least a portion of a currently selected substrate module;

characterized by:

(a) a substrate holding platform (9) on a precision stage (12) which provides x and y motion to the substrate (10/6), with respect to the projection optics which ha s an imaging position, for scanning the mask image on the substrate, during an operational period of time in which the substrate is locked to said substrate holding platform (9) with a currently selected module of said substrate at said imaging position of said projection optics; and (b) a substrate docking fixture (1) for temporarily immobilizing said substrate to permit relative movements between said substrate holding platform (9) and the substrate (10/6), during a relocation period of time in which the substrate is temporarily unlocked from said substrate holding platform (9), so as to shift the relative location of the substrate (10/6) from a currently selected module at the imaging position of said projection optics of said substrate to a subsequently selected substrate module at the imaging position of said projection optics.

16. A high-throughput, high-resolution, projection imaging system according to claim 15, further characterized in that:
said substrate docking fixture (1) comprises a vacuum chuck (2).

17. A high-throughput, high-resolution, projection imaging system according to claim 15, further characterized in that:
said substrate docking fixture (1) comprises a set (2) of vacuum fingers.

18. A high-throughput, high-resolution, projection imaging system according to claim 17, further characterized in that:
said substrate docking fixture (1) comprises a set (2) of vacuum fingers with linear translational capability so as to be movable with respect to said substrate (10/6) in such fashion a that it always grips said substrate at selected contact points.

19. A high-throughput, high-resolution, projection imaging system according to claim 15, further characterized in that:
said substrate is in the form of a continuous web feeding from a supply position to a take-up position via the imaging position; and
said substrate docking fixture comprises a set (2) of substrate grippers at opposite sides of the imaging position, to immobilize said substrate temporarily while said substrate holding platform (9) is moved with respect to said substrate, in such fashion that the substrate is repositioned from the currently selected substrate module at the imaging position to the subsequently selected module at the imaging position.

20. A high-throughput, high-resolution, projection imaging system according to claim 19, further characterized in that:
said substrate docking fixture comprises a set (2) of substrate grippers, at opposite sides of the imaging position, in the vicinities respectively of supply position and take-up position, to immobilize said substrate temporarily while said substrate holding platform (9) is moved with respect to said substrate, in such fashion that the substrate holding platform (9) on said substrate stage (12) serves both as a substrate feed device and as a substrate scanning motion device.

21. A high-throughput, high-resolution, projection imaging system according to claim 15, further characterized in that:
said substrate docking fixture (1) comprises means to reposition the substrate temporarily out of the way of said substrate holding platform (9) and the projection optics.

22. A high-throughput, high-resolution, projection imaging system according to claim 15, further characterized in that:
said substrate docking fixture (1) comprises selectively positionable substrate edge stop pins to stop substrate motion at a predetermined position to allow the substrate holding platform (9) to move to a predetermined relative position while the substrate is docked.

23. A high-throughput, high-resolution, projection imaging system according to claim 15, further characterized in that:
said substrate holding platform (9) is equipped with selectively activatable vacuum means and with selectively activatable air bearing pressure means for selectively locking said substrate and unlocking said substrate.

24. A high-throughput, high-resolution, projection imaging system according to claim 15, further characterized by:
control means (30) to establish time durations and operational controls for said substrate docking fixture (1) for each of the following three operating modes:
Loading Mode, in which said substrate docking fixture (1) supplies substrate to said substrate holding platform (9) with a first currently selected substrate module in position at the imaging position;
Processing Mode, in which said substrate docking fixture (1) is non-operational while said substrate holding platform (9), with a first currently selected substrate module in position at the imaging position, locks onto the substrate for processing; and
Repositioning Mode, in which said substrate docking fixture (1) is operational to immobilize the substrate while said substrate holding platform (9) unlocks from the substrate and supplies a repositioning motion of said holding platform (9) with respect to the substrate;
whereby a stage with a relatively small travel range may be used to process a substrate area larger than the travel range of the stage, one module at a time, using the motion capability of the scanning stage itself to accomplish repositioning from a currently selected substrate module to a subsequently selected substrate module with the assistance of the substrate docking fixture.

25. A precision imaging system according to claim 1, further characterized in that:
said scanning stage subsystem capable of scanning the mask and the substrate comprises two separate stages, a mask scanning stage (16) on which is mounted the mask (14) to its holder (9), said holder (9) being significantly larger than the supporting means of said stage subsystem (12).

* * * * *